US007712436B2

(12) United States Patent
Yamazawa

(10) Patent No.: US 7,712,436 B2

(45) Date of Patent: May 11, 2010

(54) PLASMA PROCESSING APPARATUS WITH FILTER CIRCUIT

(75) Inventor: Yohei Yamazawa, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 95 days.

(21) Appl. No.: 12/025,996

(22) Filed: Feb. 5, 2008

(65) Prior Publication Data

US 2008/0197780 A1 Aug. 21, 2008

Related U.S. Application Data

(60) Provisional application No. 60/916,313, filed on May 7, 2007.

(30) Foreign Application Priority Data

Feb. 15, 2007 (JP) ............................ 2007-034492

(51) Int. Cl.

*C23C 16/00* (2006.01)
*C23F 1/02* (2006.01)

(52) U.S. Cl. ............................ 118/723 HC; 118/723 I; 118/723 E; 118/723 R; 156/345.52; 156/345.51; 156/345.44

(58) Field of Classification Search ........... 118/723 HC, 118/723 I, 723 E, 723 R, 715, 723; 156/345.52, 156/345.51, 345.44–345.48; 315/111.71, 315/111.51, 111.41, 111.21

See application file for complete search history.

(56) References Cited

U.S. PATENT DOCUMENTS

2007/0235426 A1* 10/2007 Matsumoto et al. .... 219/121.43
2007/0284344 A1* 12/2007 Todorov et al. ........ 219/121.54

* cited by examiner

*Primary Examiner*—Tuyet Vo

(74) *Attorney, Agent, or Firm*—Oblon, Spivak, McClelland, Maier & Neustadt, L.L.P.

(57) ABSTRACT

A plasma processing apparatus includes a first high frequency power for outputting a first high frequency, electrically connected to a first electrode disposed inside a depressurizable processing chamber; a heater power supply electrically connected to a heating element provided in the first electrode via filter circuits for reducing noise of the first high frequency. The plasma processing apparatus further includes air core primary inductors provided in primary stages of the filter circuits when seen from the heating element; and a grounded conductive case for surrounding or accommodating the primary inductors.

24 Claims, 8 Drawing Sheets

MATCHING UNIT
PROCESSING GAS SUPPLY UNIT
FILTER UNIT
FILTER UNIT
HEATER POWER SUPPLY
HEATER POWER SUPPLY
MATCHING UNIT
GAS EXHAUST UNIT

W
44
38
40
40 (IN)
40 (OUT)
42
12
a
b
c
d
52 (IN)
52 (OUT)
50
48
46
45
28
54 (IN)
54 (OUT)
100 (1)
100 (2)
112 (1)
112 (2)
106 (1)
106 (2)
102 (1)
102 (2)
104 (1)
104 (2)
108 (1)
108 (2)
110 (1)
110 (2)
114 (1)
114 (2)
T (1)
T (2)
m (1)
m (2)
n (1)
n (2)
56 (IN)
56 (OUT)
58 (IN)
58 (OUT)
HEATER POWER SUPPLY
HEATER POWER SUPPLY
FILTER UNIT

54(IN)
56(IN)
116
(106(1), 106(2))
118
110(1), 110(2)
124
108(1), 108(2)
122
C(1)
C(2)
114C
B(1)
B(2)
114B
121
T(1)
T(2)
A(1)
A(2)
114A
120

PLASMA PROCESSING APPARATUS WITH FILTER CIRCUIT

FIELD OF THE INVENTION

The present invention relates to a plasma processing apparatus in which a heating element is provided in a high frequency electrode inside a processing chamber capable of being depressurized; and, more particularly, to a plasma processing apparatus in which a filter circuit for blocking a high frequency is provided in a power feed line for supplying power to a heating element.

BACKGROUND OF THE INVENTION

When a semiconductor device or an FPD (flat panel display) is microprocessed by using a plasma, it is extremely crucial to control a temperature and a temperature distribution of a substrate and a plasma density distribution on a substrate to be processed (a semiconductor wafer, a glass substrate or the like). If the temperature of the substrate is not properly controlled, it is difficult to secure process uniformity on a surface of the substrate, thereby deteriorating a production yield of a semiconductor device or a display device.

Generally, a mounting table or a susceptor for mounting thereon a substrate to be processed inside a chamber of a plasma processing apparatus, especially a capacitively coupled plasma processing apparatus, functions as a high frequency electrode for applying a high frequency power to a plasma space, as a support member for supporting a substrate by an electrostatic adsorption or the like and as a temperature control unit for controlling the substrate at a predetermined temperature by heat conduction. The mounting table serving as the temperature control unit is required to properly compensate a heat distribution caused by a substrate supporting structure or a distribution of heat transfer characteristics on the substrate caused by nonuniformity of a radiant heat from a plasma or a chamber wall.

Conventionally, in order to control a temperature of a top surface of the susceptor (and further a temperature of the substrate), there has been widely used a method for supplying a coolant whose temperature controlled by a chiller unit into a coolant passageway provided inside a susceptor or a susceptor support to be circulated therein. However, the above method is disadvantageous in that it is difficult to change a temperature of the coolant at a high speed and, also, the temperature cannot be raised and lowered at a high speed due to poor responsiveness in temperature control. Recently, a plasma processing, e.g., a plasma etching, requires a method for successively processing a multilayer film on a substrate to be processed inside a single chamber instead of multiple chambers. In order to implement such method, it is crucial to have a technique capable of raising and lowering a temperature of a mounting table at a high speed. For the above reasons, a heater capable of precisely controlling a susceptor temperature and further a substrate temperature at a high speed by controlling Joule heat of a heating element is attracting attention again.

Meanwhile, in case where a lower plate dual frequency application type in which a high frequency power supply is connected to a susceptor in view of plasma control and the above heater in which a heating element is provided in a susceptor in view of temperature control are used at the same time, if a part of a high frequency applied to the susceptor enters a heater power supply via a heater power feed line, an operation or a performance of the heater power supply may deteriorate. Especially, the heater power supply capable of high-speed control performs an ON/OFF control or a switching control with high sensitivity by using a semiconductor switching device such as an SSR (solid state relay) or the like, so that misoperation may easily occur by high frequency noise. To that end, it is common to provide in the heater power feed line a filter circuit for efficiently reducing the high frequency noise.

Generally, such filter circuit includes a plurality of LC low pass filters each having a single coil (inductor) and a single capacitor, the LC low pass filters being connected at multiple stages in the form of a ladder. For example, if the high frequency noise can be reduced by 1/10 in each stage of the LC low pass filter, it can be reduced by 1/100 in a second-stage connection and to 1/1000 in a third-stage connection.

(Patent Document 1) Japanese Patent Application Publication No. 2006-286733

As set for the above, in the conventional plasma processing apparatus, the function of the filter circuit provided in the heater power feed line focuses on reducing the high frequency noise from the high frequency power supply via the susceptor in view of ensuring normal operation and performance of the heater power supply. Thus, a coil having a small inductance and a capacitor having a large capacitance are used in each of the LC low pass filters in the filter circuit.

However, the inventors of the present invention have found, during the development and the evaluation of a plasma processing apparatus using a heater in a susceptor together with applying a high frequency power to a lower plate, that the conventional filter circuit has a problem in processing performance. Namely, they have found that the RF power loss in the conventional filter is so large that it cannot be neglected in the processing performance, in addition to a known fact that a predetermined correlation exists between a processing performance (e.g., an etching rate) and a loss of high frequency power applied from a high frequency power supply to a susceptor (i.e., the processing performance deteriorates as the RF power loss increases). Moreover, the inventors of the present invention have found that the RF power loss in the filter circuit is not determined by the circuit design, and varies even between plasma apparatuses of a same configuration, thereby causing differences in the processing performance. The inventors of the present invention have conducted numerous tests and wholehearted studies by considering the above drawbacks, thereby conceiving the present invention.

SUMMARY OF THE INVENTION

In view of the above, the present invention provides a plasma processing apparatus in which a heating element is provided in a high frequency electrode, capable of achieving safety and reliability of an operation performance of a heater power supply and also improving repeatability and reliability of a processing performance by minimizing a high frequency power loss occurring in a heater power feed line.

In accordance with the present invention, there is provided a plasma processing apparatus comprising a first high frequency power for outputting a first high frequency, electrically connected to a first electrode disposed inside a depressurizable processing chamber; a heater power supply electrically connected to a heating element provided in the first electrode via filter circuits for reducing noise of the first high frequency; air core primary inductors provided in primary stages of the filter circuits when seen from the heating element; and a grounded conductive case for surrounding or accommodating the primary inductors.

In the above configuration, the primary inductors of the filter circuits are air core coils. By greatly increasing the inductance of the air core coils, the high frequency power loss can be remarkably reduced compared to a coil having a small inductance or a coil having a magnetic core such as ferrite or the like. Further, by accommodating or arranging the air core coils in the conductive case having a ground potential while being separated from an inner wall of the case (by about 10 mm or more from experience), the stray capacitance of the air core coils can be reduced and, further, the RF power loss can be further decreased. Preferably, the case is made of a stainless steel having a high relative magnetic permeability.

It is preferable that an inductance of the primary inductors is greater than or equal to about 5 μH, and a stray capacitance between the primary inductors and ground potential parts is smaller than or equal to about 30 pF. By satisfying such numerical conditions, a ratio (which is a filter power loss) of the RF power loss of the primary inductors and/or the entire filter circuit with respect to the total RF power supplied from the first high frequency power supply is controlled below a reference value, thereby improving the repeatability of the processing performance.

Further, it is preferable that the primary inductors are arranged to be spatially parallel to each other in the case, and are divided into a plurality of air core coils electrically connected in series. With this separate type configuration, the total inductance of the primary inductors can be made greater in a limited space of the case. In this case, in order to reduce the total stray capacitance of the primary indictors, it is preferable that an air core coil positioned in a most primary stage has a large inductance as possible, and an air core coil positioned in the most primary stage has a small stray capacitance as possible.

Further, it is preferable that primary capacitors are connected between ground potential parts and terminals of the primary inductors located away from the heating element, and first connection node between the primary inductors and the primary capacitors are electrically connected to an output terminal of the heater power supply. In addition, one terminals of secondary inductors are connected to the first connection nodes; secondary capacitors are connected between other terminals of the secondary inductors and the ground potential parts; and second connection nodes between the secondary inductors and the secondary capacitors are electrically connected to an output terminal of the heater power supply. In this case, the primary capacitors, the secondary inductors and the secondary capacitors may be accommodated in the case. Preferably, a grounded electromagnetic shielding plate is provided between the primary inductors and the secondary inductors. The secondary inductors may include coils each having a magnetic core.

Further, it is preferable that the plurality air core coils electrically connected in series are arranged substantially in a single row, and spiral directions and connections of coil wires are set such that a coupling coefficient of a mutual inductance therebetween is greater than zero (preferably close to 1). With this configuration, it is possible to effectively increase the inductance of the air core coils and further to increase the inductance of the entire primary inductors. With this configuration, the inductance of each air core coils can be made greater efficiently, and the total inductance of the primary inductors can be made greater.

Further, it is preferable that a first and a second output terminal of the heater power supply are connected to a first and a second terminal of the heating element via a first and a second power feed line, respectively, and a first and a second air core primary inductor is provided in the first and the second power feed line, respectively. In this case, an inductance of the first and the second primary inductor is preferably greater than or equal to about 5 μH, and a stray capacitance between ground potential parts and the first and the second primary inductor is preferably smaller than or equal to about 30 pF. Further, it is preferable that the first and the second primary inductor are arranged concentrically.

Further, it is preferable that a number of air core coils forming the first primary inductor and the same number of air core coils forming the secondary inductor are provided in the case, and air core coils in the first power feed line are arranged concentrically with air core coils in the second power feed line corresponding to the air core coils in the first power feed line in electrical arrangements in the power feed lines. In this case, spiral directions of coil wires are preferably set such that a coupling coefficient of a mutual inductance is greater than zero between the air core coils in the first power feed line and the air core coils in the second power feed line, the air core coils being disposed concentrically. With this configuration, it is possible to effectively increase the inductance of the air core coils and further to increase the inductance of the entire primary inductors.

Further, it is preferable that the heating element is buried in a main surface of the first electrode via an insulator. Preferably, the heating element can be sealed in a dielectric material forming the electrostatic chuck.

Further, it is also possible that the heating element is divided into an inner heating element and an outer heating element in a radial direction of an electrode, and individual heater power supplies are electrically connected to the inner heating element and the outer heating element via individual filter circuits.

Further, it is preferable that the first electrode serves as a lower electrode for mounting thereon a target object. In addition, the case is preferably disposed immediately below a vicinity of the first electrode.

Further, it is preferable that the first high frequency is 13.56 MHz or a frequency adjacent thereto. From experience, the frequency preferably ranges from about 6.78 MHz (half of 13.56 MHz) to about 27.12 MHz (twice of 13.56 MHz).

Further, the processing vessel has therein a second electrode facing the first electrode in parallel, the first and the second electrode being separated from each other at a desired gap. The second electrode is electrically connected with a second high frequency power supply for outputting a second high frequency (preferably greater than or equal to 40 MHz).

Further, it is preferable that a coolant passageway is provided in the first electrode or in a support member thermally coupled to the first electrode, and a coolant having a temperature controlled by a chiller unit is supplied to the coolant passageway. In this case, the first electrode has the cooing function of the chiller and the heating function of the heater, so that the temperature can be raised or lowered at a high speed.

In accordance with the plasma processing apparatus of the present invention, the above configuration and operation enables to achieve safety and reliability of an operation performance of a heater power supply in a plasma processing apparatus in which a heating element is provided in a high frequency electrode and to improve repeatability and reliability of a processing performance by minimizing a high frequency power loss occurring in a heater power feed line.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENT

The embodiments of the present invention will be described with reference to the accompanying drawings which form a part hereof.

Figure 1:
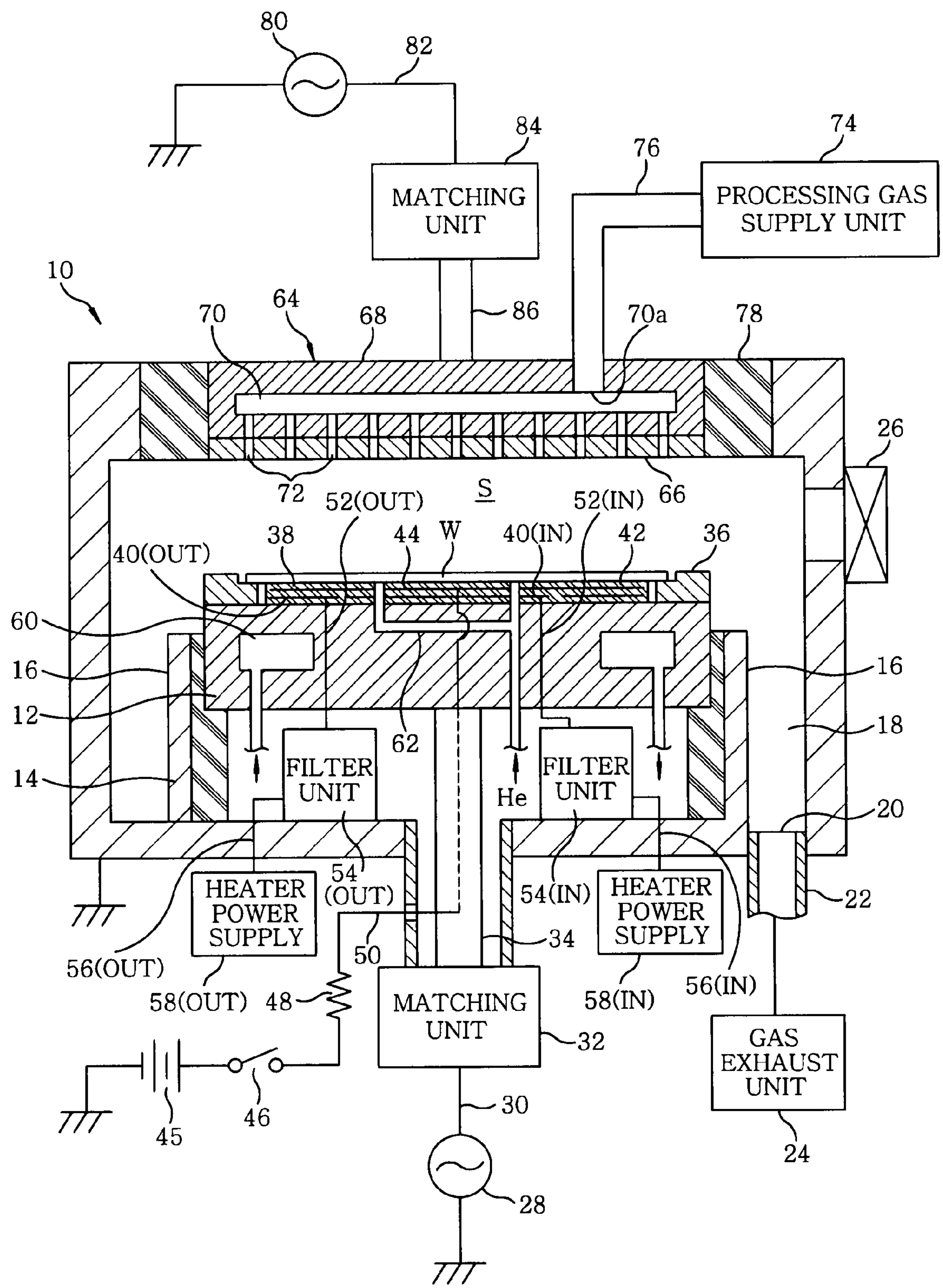
FIG. 1 shows a vertical cross sectional view of a configuration of a plasma etching apparatus in accordance with an embodiment of the present invention.

FIG. 1 shows a configuration of a plasma etching apparatus in accordance with an embodiment of the present invention. The plasma etching apparatus is configured as a capacitively coupled plasma etching apparatus having an upper-and-lower plate dual frequency application type, and has a cylindrical chamber (processing vessel) 10 made of a metal such as aluminum, stainless steel or the like. The chamber 10 is frame grounded.

A circular plate-shaped susceptor 12 for mounting thereon a target substrate, e.g., a semiconductor wafer W, is horizontally provided in the chamber 10 and serves as a lower electrode. The susceptor 12 is made of, e.g., aluminum, and is supported, without being grounded, by an insulating cylindrical supporting portion 14 vertically extended from a bottom of the chamber 10, the supporting portion 14 being made of, e.g., ceramic. A ring-shaped gas exhaust path 18 is formed along a periphery of the cylindrical supporting portion 14 between an inner wall of the chamber and a conductive cylindrical supporting portion 16 vertically extended from the bottom of the chamber 10. A gas exhaust port 20 is provided at a bottom portion of the gas exhaust path 18. Further, a gas exhaust unit 24 is connected to the gas exhaust port 20 via a gas exhaust line 22. The gas exhaust unit 24 has a vacuum pump such as a turbo-molecular pump or the like, so that a processing space inside the chamber 10 can be depressurized to a desired vacuum level. Attached to a sidewall of the chamber 10 is a gate valve 26 for opening and closing a loading/unloading port of the semiconductor wafer W.

A first high frequency power supply 28 is electrically connected to the susceptor 12 via an RF cable 30, a lower matching unit 32 and a lower power feed rod 34. Here, the high frequency power supply 28 outputs a predetermined first high frequency, e.g., 13.56 MHz, which contributes to the ion attraction to the semiconductor wafer W on the susceptor 12. The RF cable 30 is formed as, e.g., a coaxial cable. The lower matching unit 32 accommodates therein a matching circuit for performing matching between an impedance of the high frequency power supply 28 side and an impedance of a load (mainly, electrode and plasma) side, and also has therein an automatic matching RF sensor, a controller, a stepping motor and the like.

The susceptor 12 has a diameter slightly greater than the semiconductor wafer W. A main surface corresponding to a top surface of the susceptor 12 is divided in a radial direction into a central region, i.e., a wafer mounting portion, having substantially the same shape (circular shape) and dimension as those of the wafer W and a ring-shaped peripheral region extending from an outer periphery of the wafer mounting portion. The wafer mounting portion has thereon a semiconductor wafer W to be processed, and the ring-shaped peripheral portion has thereon a focus ring having an inner diameter slightly greater than the aperture of the semiconductor wafer W 36. The focus ring 36 is made of any one material of, e.g., Si, SiC, C, $SiO_2$, depending on an etching target material of the semiconductor wafer W.

The wafer mounting portion on the top surface of the susceptor 12 is provided with an electrostatic chuck 38 for adsorbing a wafer and a heating element 40. The electrostatic chuck 38 has a structure in which a mesh-shaped conductor 44 is sealed in a film-shaped or a plate-shaped dielectric material 42 fixed to or formed as a unit with the top surface of the susceptor 12. An external DC power supply 45 provided outside the chamber 10 is electrically connected to the conductor 44 via a switch 46, a high-resistance resistor 48 and a DC high tension line 50. The semiconductor wafer W can be adsorptively held on the electrostatic chuck 38 by Coulomb force generated by a high DC voltage applied from the DC power supply 45. Further, the DC high tension line 50 is a coated wire, and is connected to the conductor 44 of the electrostatic chuck 38 after passing through an inner portion of the cylindrical lower power feed rod 34 and then penetrating the susceptor 12 from a bottom surface thereof.

Figure 3:
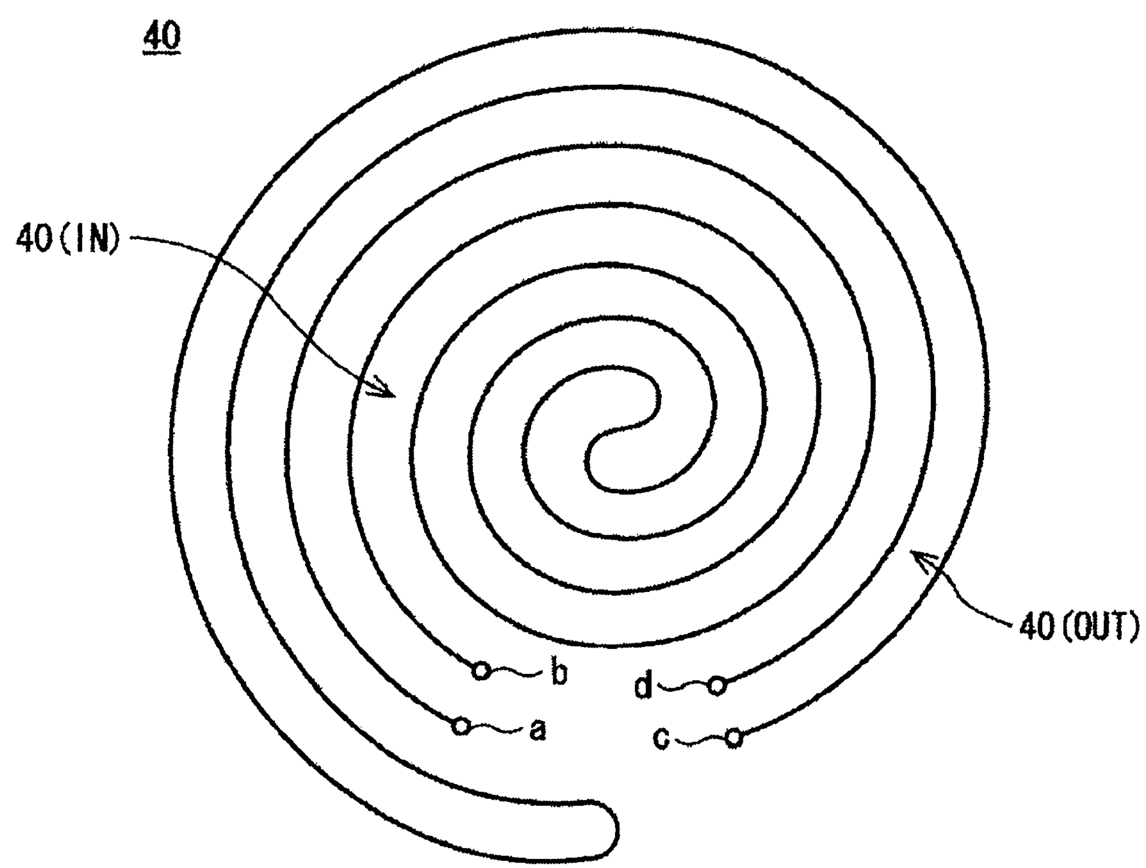
FIG. 3 illustrates a configuration example of the heating element in the embodiment.

The heating element 40 is formed as, e.g., a spiral-shaped resistance heating wire sealed in the dielectric material 42 together with the conductor 434 of the electrostatic chuck 38, and is divided in the radial direction of the susceptor 12 into an inner heating wire 40(IN) and an outer heating wire 40(OUT), as shown in FIG. 3. The inner heating wire 40(IN) is electrically connected to a heater power supply 58(IN) provided outside the chamber 10 via an insulated power feed line (or a power feed rod) 52(IN), a filter unit 54(IN) and an electrical cable 56(IN). The outer heating wire 40(OUT) is electrically connected to a heater power supply 58(OUT) disposed outside the chamber 10 via an insulated power feed line (or a power feed rod) 52 (OUT), a filter unit 54(OUT) and an electrical cable 56(OUT). The filter units 54(IN) and 54(OUT) are main features of this embodiment, so that an internal configuration and operation thereof will be described in detail later.

The susceptor 12 has therein a ring-shaped coolant passageway 60 extending in, e.g., a circumferential direction. A coolant of a predetermined temperature flows in the coolant passageway 60, the coolant being supplied from an external chiller unit (not shown) via a line. By controlling a temperature of the coolant, it is possible to control a temperature of the semiconductor wafer W on the electrostatic chuck 38. Moreover, in order to increase the control accuracy of the wafer temperature, a thermally conductive gas, e.g., He gas, is supplied from a thermally conductive gas supply unit (not shown) to a gap between the electrostatic chuck 38 and the semiconductor wafer W via a gas supply line and a gas channel inside the susceptor 12.

A shower head 64 facing the susceptor 12 in parallel is provided at a ceiling portion of the chamber 10, the shower head 64 serving as an upper electrode. The shower head 64 includes an electrode plate 66 facing the susceptor 12; and an electrode support member 68 for supporting the electrode plate 66 in an attachable and detachable manner from the rear (top) surface thereof. The electrode support member 68 has therein a gas chamber 70, and a plurality of gas discharge openings 72 penetrating from the gas chamber 70 to the susceptor 12 are formed in the electrode support member 68 and the electrode plate 66. A space S between the electrode plate 66 and the susceptor 12 serves as a plasma generation space or a processing space. A gas inlet 70*a* provided at an upper portion of the gas chamber 70 is connected with a gas supply line 76 from a processing gas supply unit 74. The electrode plate 66 is made of, e.g., Si, SiC or C, and the electrode plate 68 is made of, e.g., alumite treated aluminum.

A gap between the shower head 64 and a peripheral portion of an opening on a top surface of the chamber 10 is airtightly sealed by a ring-shaped insulator 78 made of, e.g., alumina. The shower head 64 is attached to the chamber 10 without being grounded. A second high frequency power supply 80 is electrically connected to the shower head 64 via an RF cable 82, an upper matching unit 84 and an upper power feed rod 86. Here, the high frequency power supply 80 outputs a predetermined second high frequency, e.g., 60 MHz, which contributes to the plasma generation. The RF cable 82 is formed as, e.g., a coaxial cable. The matching unit 84 accommodates therein a matching circuit for performing matching between an impedance of the high frequency power supply 80 side and an impedance of a load (mainly, electrode and plasma) side, and also has therein an automatic matching RF sensor, a controller, a stepping motor and the like.

An apparatus control unit (not shown) having, e.g., a microcomputer independently controls an operation of each unit in the plasma etching apparatus and also controls an entire operation (sequence) of the apparatus. Here, the units in the plasma etching apparatus include the gas exhaust unit 24, the high frequency power supplies 28 and 80, the switch 46 of the DC power supply 45, the heater power supplies 58(IN) and 58(OUT), the chiller unit (not shown), the thermally conductive gas supply unit (not shown), the processing gas supply unit 74 or the like.

In this plasma etching apparatus, in order to perform the etching, first of all, the semiconductor wafer W to be processed is loaded into the chamber 10 while opening the gate valve 26 and then is mounted on the electrostatic chuck 38. Further, an etching gas (generally, a gaseous mixture) is introduced into the chamber 10 at a predetermined flow rate and flow rate ratio from the processing gas supply unit 74, and a pressure inside the chamber 10 is set to be a predetermined level by using the gas exhaust unit 24. Moreover, by turning on the first and the second high frequency power supplies 28 and 80, the first high frequency (13.56 MHz) and the second high frequency (60 MHz) are outputted at predetermined power levels, respectively. These high frequencies are supplied to the susceptor (lower electrode) 12 and the shower head (upper electrode) 64 via the RF cables 30 and 82, the matching units 32 and 84 and the power feed rods 34 and 86, respectively. Furthermore, by turning on the switch 46, the thermally conductive gas (He gas) is confined in a contact interface between the electrostatic chuck 38 and the semiconductor wafer W by the electrostatic adsorptive force. Besides, cooling water whose temperature is controlled to a specific level is supplied from the chiller unit to the coolant passageway 60 in the susceptor 12. At this time, the heater power supplies 58(IN) and 58(OUT) are turned on, thereby heating the inner heating element 40(IN) and the outer heating element 40(OUT) by Joule heat, respectively. Therefore, a temperature or a temperature distribution on the top surface of the susceptor 12 is controlled to a set value. The etching gas discharged from the shower head 64 is converted into a plasma between both electrodes 12 and 64 by the discharge of high frequency, and a film on the main surface of the semiconductor wafer W is etched by radicals or ions generated from the plasma.

In this capacitively coupled plasma etching apparatus, by applying to the shower head 64 a comparatively higher second high frequency, i.e., 60 MHz, suitable for the plasma generation, it is possible to form a plasma of high density in a desired dissociation state and, hence, a high-density plasma can be obtained under the lower pressure condition. At the same time, a comparatively lower first high frequency, i.e., 13.56 MHz, suitable for the ion attraction is applied to the susceptor 12, so that highly selective and highly anisotropic etching can be performed on the semiconductor wafer W on the susceptor 12. Generally, any frequency greater than or equal to about 40 MHz can be used as the second high frequency.

Further, in this capacitively coupled plasma etching apparatus, the susceptor 12 has the cooling function of the chiller and the heating function of the heater and, also, the heating of the heater is independently controlled in the central region and the peripheral region divided in the radial direction. Therefore, the temperature can be changed, raised or lowered at a high speed and, also, a profile of temperature distribution can be variously controlled as desired.

Hereinafter, configurations and operations of the filter units 54(IN) and 54(OUT) as main features of this embodiment will be explained with reference to FIGS. 2 to 10.

Figure 2:
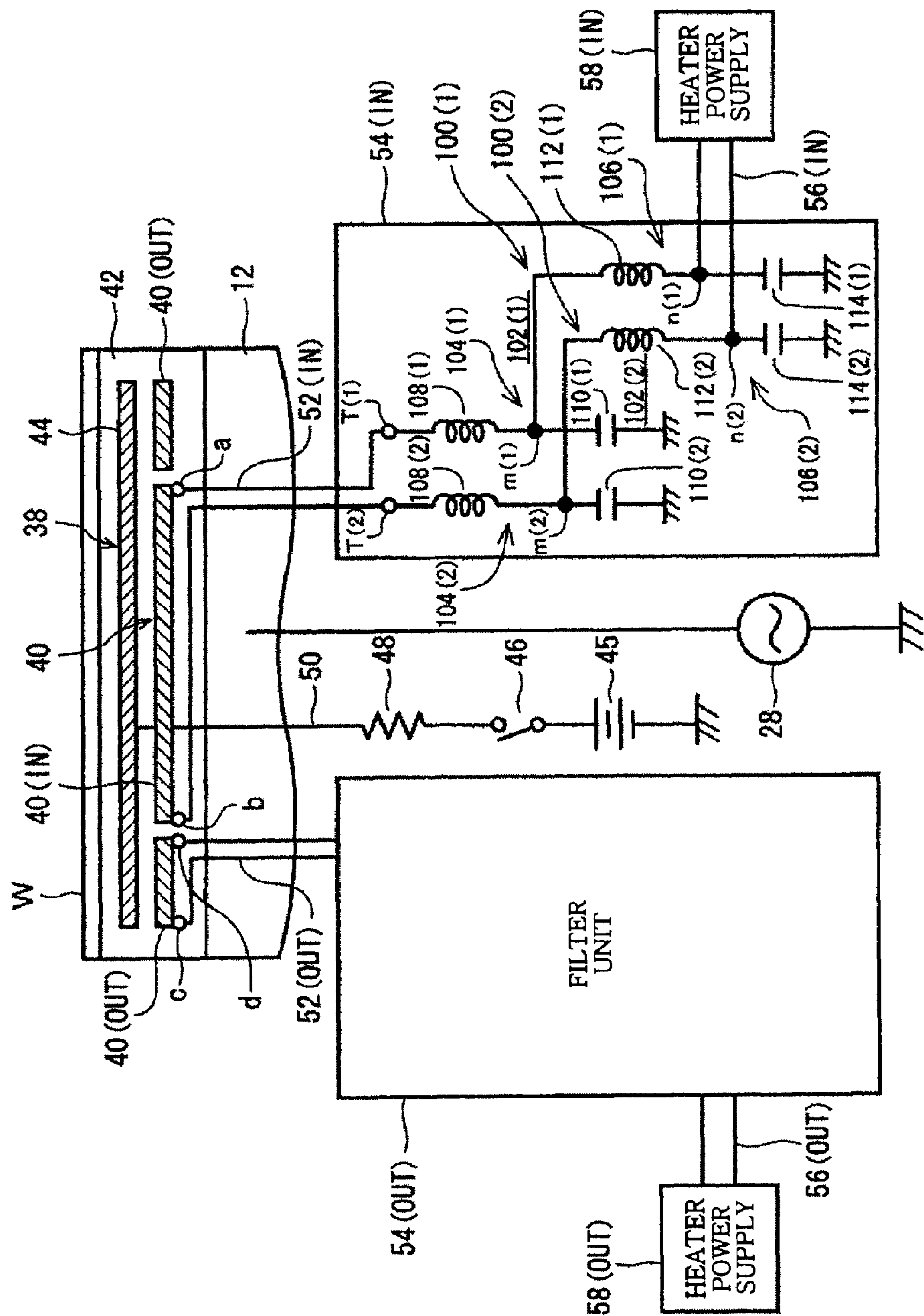
FIG. 2 describes a circuit configuration of a power supply unit for supplying power to a heating element of a susceptor in the embodiment.

FIG. 2 describes a circuit configuration of a power supply unit for supplying power to the heating element 40 provided in the susceptor 12. In this embodiment, the inner heating wire 40(IN) and the outer heating wire 40(IN) of the heating element 40 are individually connected with power supply units having substantially the same circuit configuration, so that a calorific power or an exothermic temperature of the inner heating wire 40(IN) and the outer heating wire 40(IN) are individually controlled. In the following description, only the configuration and the operation of the power supply unit connected with the inner heating element 40(IN) will be explained, because those of the power supply unit connected with the outer heating element 40(OUT) are completely the same.

The heater power supply 58(IN) is an AC power supply for performing a switching (ON/OFF) operation of a commercial frequency by using, e.g., an SSR, and is connected to the inner heating element 40(IN) via a circuit of a closed loop. More specifically, the heater power supply 58(IN) has a pair of output terminals, wherein a first output terminal is electrically connected to a first terminal a of the inner heating wire 40(IN) via a primary power feed line 100(1), whereas a second output terminal is electrically connected to a second terminal b of the inner heating wire 40(IN) via a secondary power feed line 100(2).

The filter unit 54(IN) has a primary and a secondary filter circuit 102(1) and 102(2) provided in the middle of the primary and the secondary power feed line 100(1) and 100(2), respectively. Both filter circuits 102(1) and 102(2) have substantially the same circuit configuration. In the illustrated example, a primary LC low pass filter 104(1) (or 104(2)) is connected to a secondary LC low pass filter 106(1) (or 106 (2)) sequentially in the form of a ladder when seen from the inner heating wire 40(IN).

To be more specific, the primary LC low pass filters 104(1) and 104(2) are constructed as series circuits respectively composed of one of primary inductors 108(1) and 108(2) and one of primary capacitors 110(1) and 110(2). One terminals of the primary inductors 108(1) and 108(2) or filter terminals T(1) and T(2) are connected to both terminals a and b of the inner heating wire 40(IN) via the power feed line (pair cable) 52 (IN). Further, the primary capacitors 110(1) and 110(2) are connected between the other terminals of the primary inductors 108(1) and 108(2) and ground potential parts, respectively.

The secondary LC low pass filters 106(1) and 106(2) are constructed as series circuits respectively composed of one of secondary inductors 112(1) and 112(2) and one of secondary capacitors 114(1) and 114(2). One terminals of the secondary inductors 112(1) and 112(2) are connected to connection nodes m(1) and m(2) between the primary inductors 108(1) and 108(2) and the primary capacitors 110(1) and 110(2). Moreover, the secondary capacitors 114(1) and 114(2) are connected between the other terminals of the secondary inductors 112(1) and 112(2) and ground potential parts, respectively. Furthermore, connection nodes n(1) and n(2) between the secondary inductors 112(1) and 112(2) and the secondary capacitors 114(1) and 114(2) are connected to the first and the second output terminal of the heater power supply 58(IN) via the electrical cables (pair cables) 56(IN), respectively.

In the above-configured power supply unit, during a positive polarity cycle, the current outputted from the heater power supply 58(IN) flows from the terminal a to the inner heating wire 40(IN) via the primary power feed line 100(1), i.e., the electrical cable 56(IN), the secondary inductor 112 (1), the primary inductor 108(1) and the power feed line 52(IN). Next, the current generates Joule heat in each unit of the inner heating wire 40(IN) by power supplied thereto, and then flows from the terminal b and to the heater power supply 58(IN) via the secondary power feed line 100(2), i.e., the power feed line 52(IN), the primary inductor 108(2), the secondary inductor 112(2) and the electrical cable 56(IN). During a negative polarity cycle, the current flows in the opposite direction in the same circuit. The current of the AC power outputted from the heater power supply has a commercial frequency and, hence, an impedance or a voltage drop in the primary inductors 108(1) and 108(2) and secondary inductor 112(1) and 112(2) is very small so that it can be neglected and, also, a current leaking to the earth through the primary capacitors 110(1) and 110(2) and the secondary capacitors 114(1) and 114(2) is very small so that it can be neglected.

Figure 4:
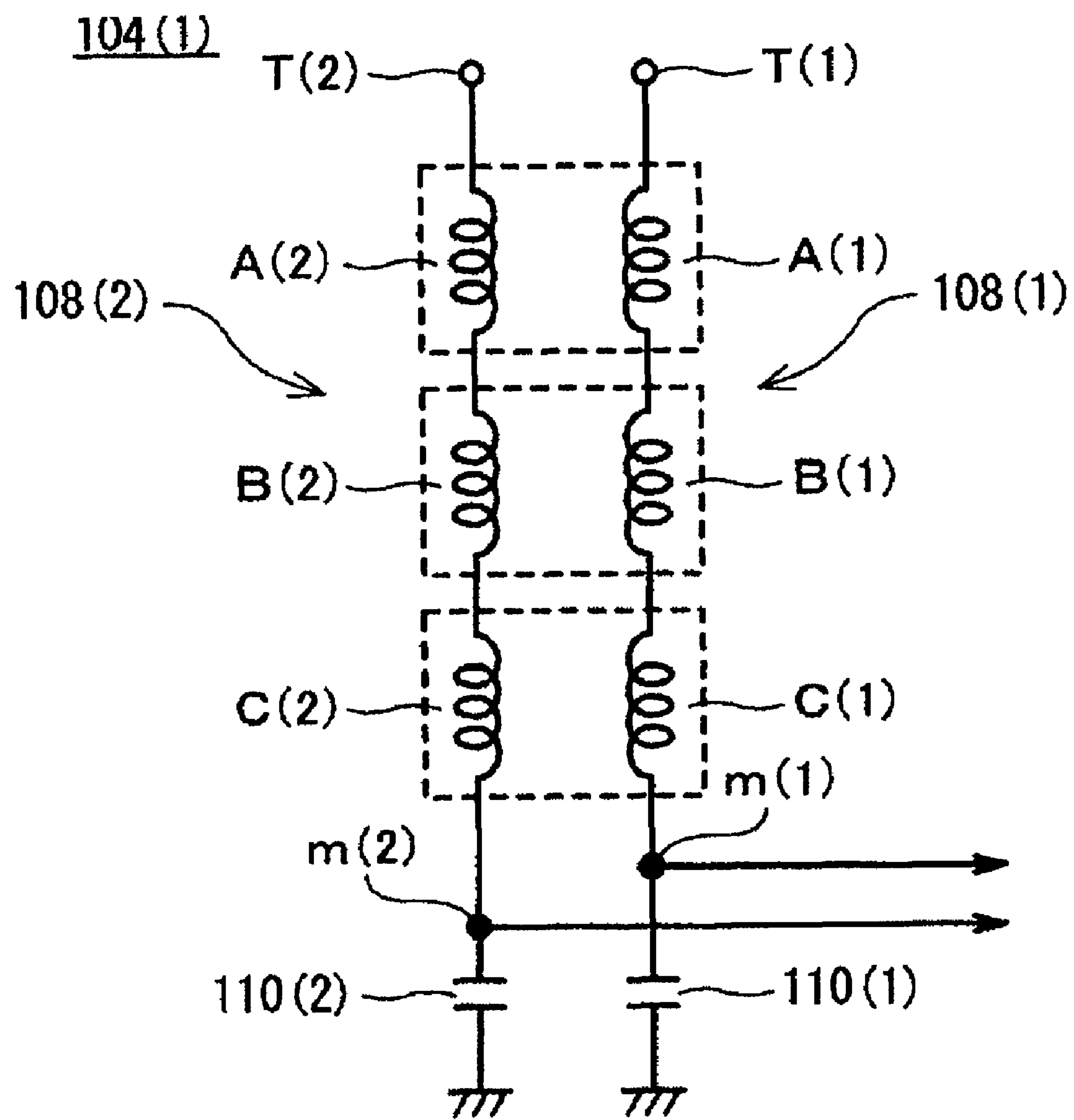
FIG. 4 depicts a circuit configuration of primary inductors in the embodiment.

One of the features in this embodiment is that the primary inductors 108(1) and 108(2) of the primary LC low pass filters 104(1) and 104(2) are formed as air core coils in view of preventing the heat generation, and include a plurality of, e.g., three, air core coils (A(1), B(1), C(1)) and (A(2), B(2), C(2)), respectively, which are electrically connected in series in view of reducing the installation space (especially, vertical space), as illustrated in FIG. 4. Further, another feature is that the air core coils (A(1), B(1), C(1)) and (A(2), B(2), C(2)) are provided in the filter unit 54(IN) in the structure shown in FIGS. 5 and 6. Moreover, it is important to set an inductance and a stray ground capacitance of the primary inductors 108 (1) and 108(2) within a predetermined range to be described later.

As depicted in FIG. 4, the three air core coils A(1) B(1) and C(1) forming the primary inductor 108(1) in the primary LC low pass filter 104(1) of the primary power feed line 100(1) are electrically connected in series in that order when seen from the inner heating wire 40(IN). Therefore, the air core coil A(1) is in the primary stage that is electrically closest to the filter terminal T(1). Further, the three air core coils A(2), B(2) and C(2) forming the primary inductor 108(2) in the primary LC low pass filter 104(2) of the secondary power feed line 100(2) are electrically connected in series in that order when seen from the inner heating wire 40(IN). Accordingly, the air core coil A(2) is in the primary stage that is electrically closest to the filter terminal T(1).

Figure 5:
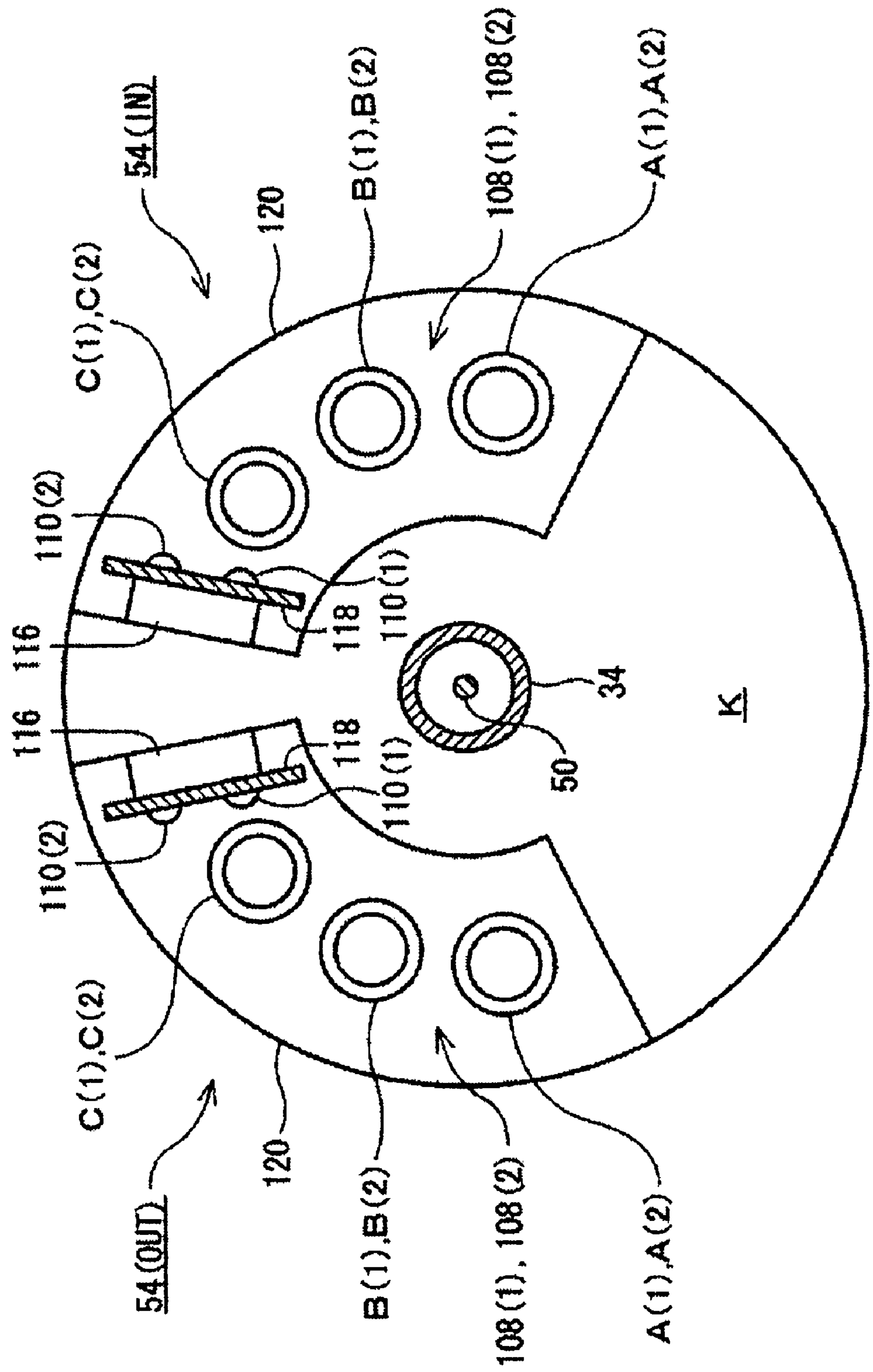
FIG. 5 provides a top view of principal parts in a filter unit in the embodiment.
Figure 6:
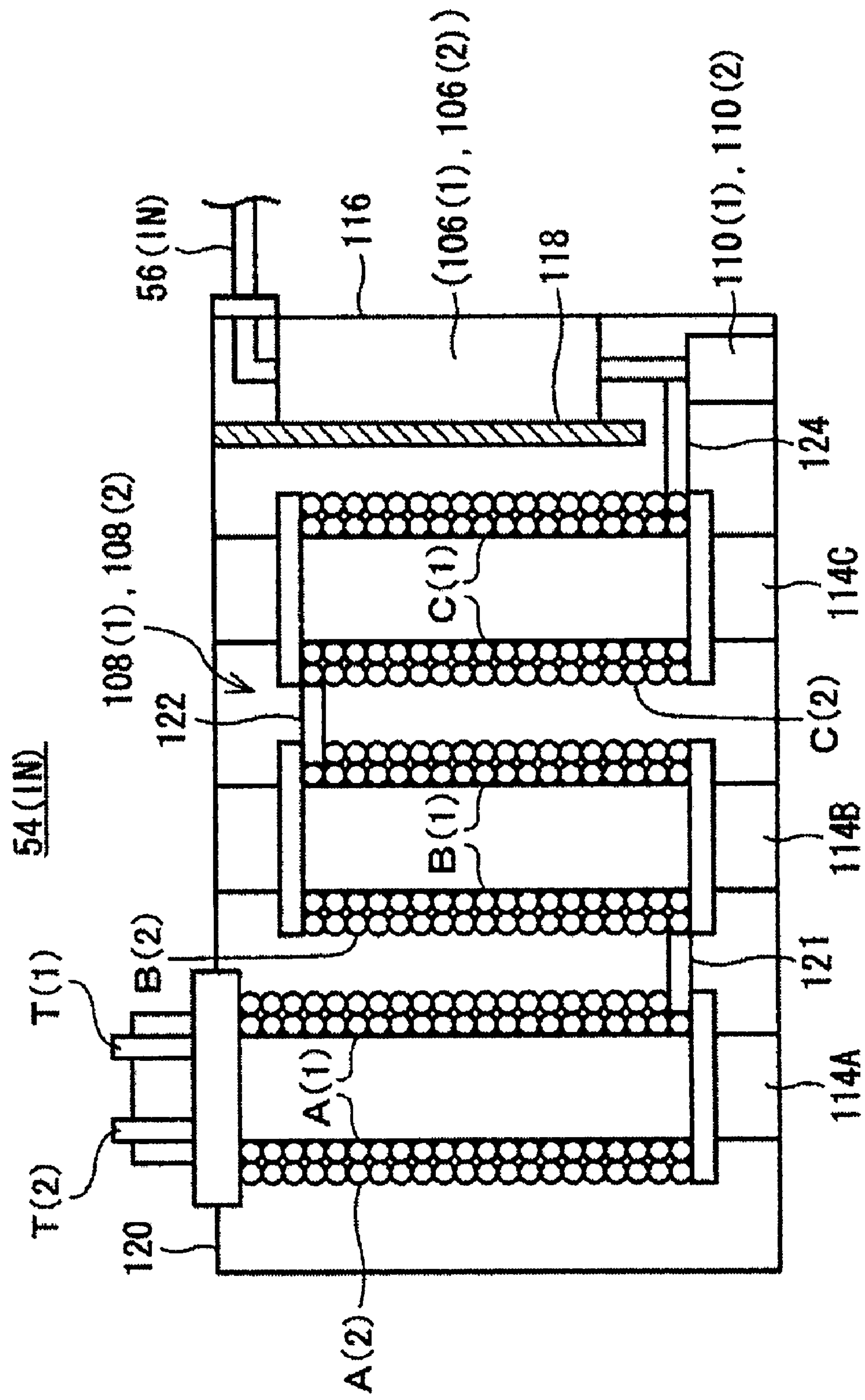
FIG. 6 presents a schematic cross sectional view of the principal parts in the filter unit in the embodiment.

As can be seen from FIGS. 5 and 6, the filter unit 54(IN) has a box-shaped cover or case 120 made of a conductive plate, and the case 120 accommodates therein entire filter components. Most of an inner space of the case 120 is occupied especially by the air core coils (A(1), B(1), C(1)) and (A(2), B(2), C(2)) forming the primary inductors 108(1) and 108(2), respectively. As a consequence, the primary capacitors 110(1) and 110(2) and the secondary LC low pass filters 106(1) and 106(2) are arranged in a small space in one corner of the case 120. The case 120 is preferably made of stainless steel having high relative magnetic permeability and capable of magnetic shielding effect sufficient to secure an efficient rust prevention.

Each of the air core coils (A(1), B(1), C(1)) and (A(2), B(2), C(2)) serve as a power feed line for supplying a fairly large current from the heater power supply 52(IN) to the inner heating wire 40 (IN), and has a thick coil wire (e.g., about ϕ4 mm to ϕ6 mm) and an unconventionally large coil size (e.g., a diameter of about 22 to about 45 mm, a length of about 150 mm to about 250 mm) to obtain a sufficiently large inductance by an air core instead of a magnetic core such as ferrite or the like, in view of preventing heat generation (power loss).

In this embodiment, the six air core coils (A(1), B(1), C(1)) and (A(2), B(2), C(2)) are effectively arranged in the case 120 by considering the space and the function. More specifically, the primary air core coils A(1) and A(2) of the primary and the secondary power feed line 100(1) and 100(2) are concentrically wound around a cylindrical or a columnar shaped supporting shaft (bobbin) 114A installed vertically along one side surface in a circumferential direction of the case 120, the supporting shaft 114A being made of, e.g., resin. In addition, the secondary air core coils B (1) and B (2) of the power feed lines 100(1) and 100(2) are concentrically wound around an additional supporting shaft 114B vertically installed on a substantially central portion in the case 120. Besides, the tertiary air core coils C(1) and C(2) of the power feed lines 100(1) and 100(2) are concentrically wound around an additional supporting shaft 114C installed vertically along the other side surface in the circumferential direction of the case 120.

As illustrated in FIG. 6, the filter terminals T(1) and T(2) are provided on top portions of the primary air core coils A(1) and A(2), respectively, and the primary air core coils A(1) and A(2) and the secondary air core coils B(1) and B (2) are connected at a lower side via a wire 121. The secondary air core coils B(1) and B(2) and the tertiary air core coils C(1) and C(2) are connected at an upper side via a wire 22. Further, the tertiary air core coils C(1) and C(2) and the primary capacitors 110(1) and 110(2) are connected at the lower side via a wire 124.

In this embodiment, among the air core coils (A(1), B(1), C(1)) and (A(2), B(2), C(2)) arranged in the case 120 as described above, the air core coils wound around the same supporting shaft (bobbin) have the same spiral direction of coil wires. Moreover, between the air core coils wound around horizontally adjacent supporting shafts, the spiral directions of coil wires are set such that the directions of axial magnetic field generated in central portions of the coils are opposite to each other. For example, when magnetic force lines penetrate from up to down through the air core coils A(1) and A(2) in axial directions thereof, magnetic force lines penetrate from down to up through the air core coils B(1) and B(2) in axial directions thereof. Accordingly, in the primary air core coils A(1) and A(2) wound around the supporting shaft (bobbin) 114A in a concentrical shape, the high frequency currents in the two power feed lines, which have conducted from the susceptor 12 via the inner heating wire 40(IN) and the power feed line 52(IN), flow in the same spiral direction. At that time, if the high frequency current simultaneously flows in both air core coils A(1) and A(2), the magnetic flux penetrating one of the air core coils flows in the same direction in the same amount as the magnetic flux penetrating the other of the air coils. Accordingly, a mutual inductance having a positive coupling coefficient can be obtained between the air core coils A(1) and A(2). In the same manner, mutual inductances having positive coupling coefficients can also be obtained between the secondary air core coils B(1) and B(2) and between the tertiary air core coils C(1) and C(2).

In addition, the spiral direction of the high frequency current flowing in the primary air core coil A(1) or A(2) is opposite to that of the high frequency current flowing in the secondary air core coil B(1) or B(2) horizontally adjacent thereto, so that a mutual inductance having a positive coupling coefficient can be obtained. Similarly, a positive mutual inductance can also be obtained between the secondary air core coil B(1) or B(2) and the tertiary air core coil C(1) or C(2) adjacent to each other.

In this embodiment, the air core coils (A(1), B(1), C(1)) and (A(2), B (2), C(2)) accommodated in the case 120 have a large self-inductance and a positive mutual inductance, as described above. As a result, the primary inductors 108(1) and 108(2) including the above air core coils can have an inductance greater than or equal to about 5 μH.

In the present invention, it is preferable that the primary air core coils A(1) and A(2) have a large inductance in view of minimizing the RF power loss. In this embodiment, the number of turns of the primary air core coils A(1) and A(2) is increased compared to those of the secondary air core coils B(1) and B(2) and the tertiary air core coils C(1) and C(2), as shown in FIG. 6. As a consequence, the inductances of the primary air core coils A(1) and A(2) are set to be greater than those of the other air core coils A(1), C(1), A(2) and C(2).

Figure 7:
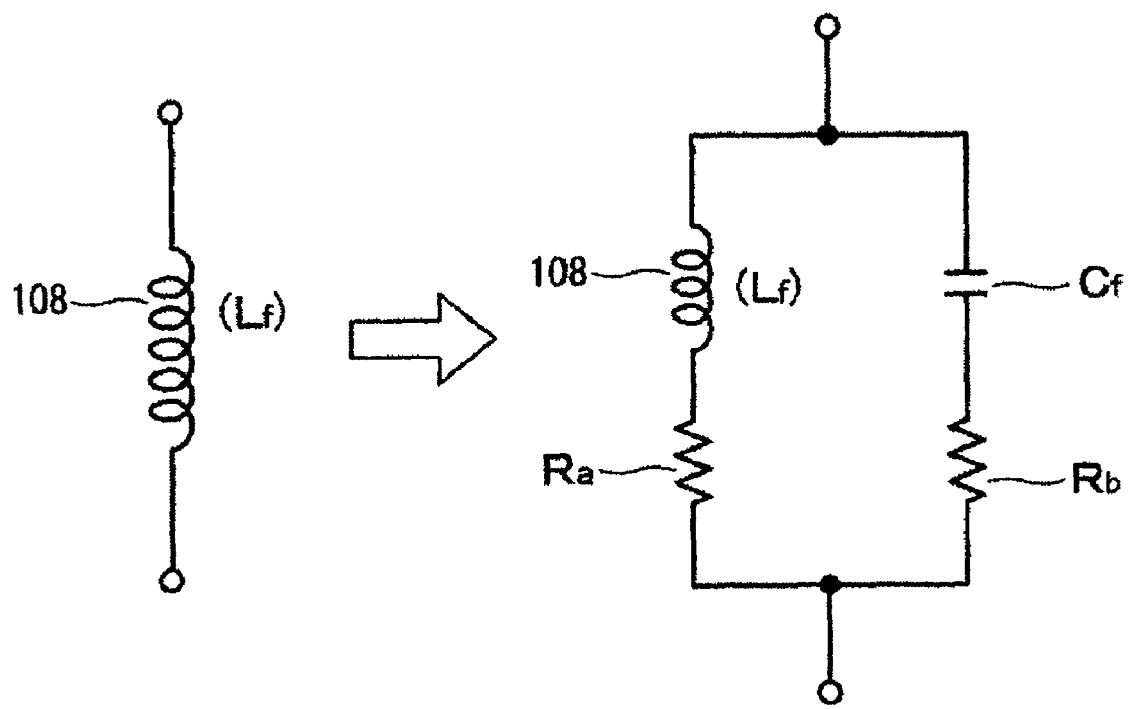
FIG. 7 shows an equivalent circuit of an air core coil in the embodiment.

Meanwhile, each of the primary inductors 108(1) and 108 (2) has a stray capacitance and a loss (resistance), and thus can be represented by an equivalent circuit shown in FIG. 7. In the equivalent circuit of FIG. 7, $C_f$ indicates the stray capacitance, and $R_a$ and $R_b$ represent the loss (resistance). As an inductance $L_f$ of the primary inductor 108 increases, the high frequency current flowing in the primary inductor 108 and the resistance $R_a$ needs to be decreased to thereby reduce the power loss generated in the resistance $R_a$. However, if the stray capacitance $C_f$ has a non-negligible value, a considerable amount of power loss occurs in the resistance $R_b$ by the high frequency current flowing in the bypass passage having the stray capacitance $C_f$ and the resistance $R_b$. Thus, in order to reduce the power loss of the primary inductor 108, it is also crucial to minimize the stray capacitance $C_f$.

In view of the above, in this embodiment, all the air core coils (A(1), B(1), C(1)) and (A(2), B(2), C(2)) forming the primary inductors 108(1) and 108(2) are separated from the inner wall surface (ground potential surface) of the case 120 by about 10 mm or more, thereby suppressing the stray capacitance between the primary inductors 108(1) and 108(2) and the ground potential parts, i.e., the stray ground capacitance $C_f$, below about 30 pF.

When a total inductance of all the inductances of the three air core coils A(1), B(1) and C(1) (or the other three air core coils A(2), B(2) and C(2)) is constant, the total stray ground capacitance decreases as the number of turns of the primary air core coils A(1) and A(2) increases. When a total stray ground capacitance of all the stray ground capacitances of the three air core coils A(1), B(1) and C(1) (or the other three air core coils A (2), B (2) and C(2)) is constant, a total stray ground capacitance decreases as the stray capacitance of the primary air core coils A(1) and A(2) decreases. This is verified by the simulation and the test performed by the inventors of the present invention.

As set forth above, when the total stray ground capacitance of the primary inductors 108(1) and 108(2) needs to be reduced, it is most effective to increase the wires of the primary air core coils A(1) and A(2) or decrease the stray capacitance thereof. In view of this, it is preferable to, e.g., form a large gap between the primary air core coils A(1) and A(2) and the inner wall of the case 120. Or, it is preferable to maximize the number of turns of the primary air core coils A(1) and A(2) compared to that of other air core coils (B(1), C(1)) and (B(2) and C(2)).

As illustrated in FIGS. 5 and 6, a box 116 made of, e.g., resin, is provided on a sidewall of the case 120 near the tertiary air core coils C(1) and C(2), and the box 116 accommodates therein the entire secondary LC low pass filters 106(1) and 106(2). The primary capacitors 110(1) and 110(2) are arranged under the box 116. Further, an electromagnetic shielding plate 118 is disposed between the box 116 and the tertiary air core coils C(1) and C(2).

In the plasma etching apparatus of this embodiment, a part of the high frequency applied from the first high frequency power supply 28 to the susceptor 12 is transferred from the inner heating element 40(IN) to the filter circuits 102(1) and 102(2) via the first and the secondary power feed line 100(1) and 100(2). The high frequency current entering the filter circuits 102(1) and 102(2) is reduced to, e.g., 1/10, in the primary LC low pass filters 104(1) and 104(2), so that the high frequency current entering the secondary LC low pass filter 106(1) and 106(2) is very small. For that reason, the power loss of the secondary inductors 112(1) and 112(2) can be almost neglected, and the secondary inductors 112(1) and 112(2) can be formed as coils each having a small magnetic core. Above all, the secondary inductors 112(1) and 112(2) and the tertiary air core coils C(1) and C(2) adjacent thereto are shield by the shielding plate 118, because the magnetic coupling therebetween is not preferable. Preferably, the shielding plate 11 is made of the same material forming the case 120.

As set forth above, most of the high frequency entering from the susceptor 12 to the filter circuits 102(1) and 102(2) via the power feed lines 100(1) and 100(2) are reduced and lost in the primary LC low pass filters 104(1) and 104(2). As a consequence, most of the RF power loss in the filter circuits 102(1) and 102(2) occurs in the primary LC low pass filters 104(1) and 104(2).

The inventors of the present invention have performed the simulation to obtain a filter power loss rate (%), i.e., a ratio of the RF power loss occurring in the filter circuits 102(1) and 102(2) to the total high frequency power (output power of the high frequency power supply 28) in the plasma etching apparatus of this embodiment. As a result, a contour map shown in FIG. 8 was obtained, in which the total inductance L and the total stray ground capacitance C of the primary inductors 108(1) and 108(2) are respectively represented by the vertical and the horizontal axis. The inductance L and the stray ground capacitance C respectively correspond to an apparent inductance and a stray grounded capacitance of the primary inductors 108(1) and 108(2) when seen from the heating element 40.

Figure 8:
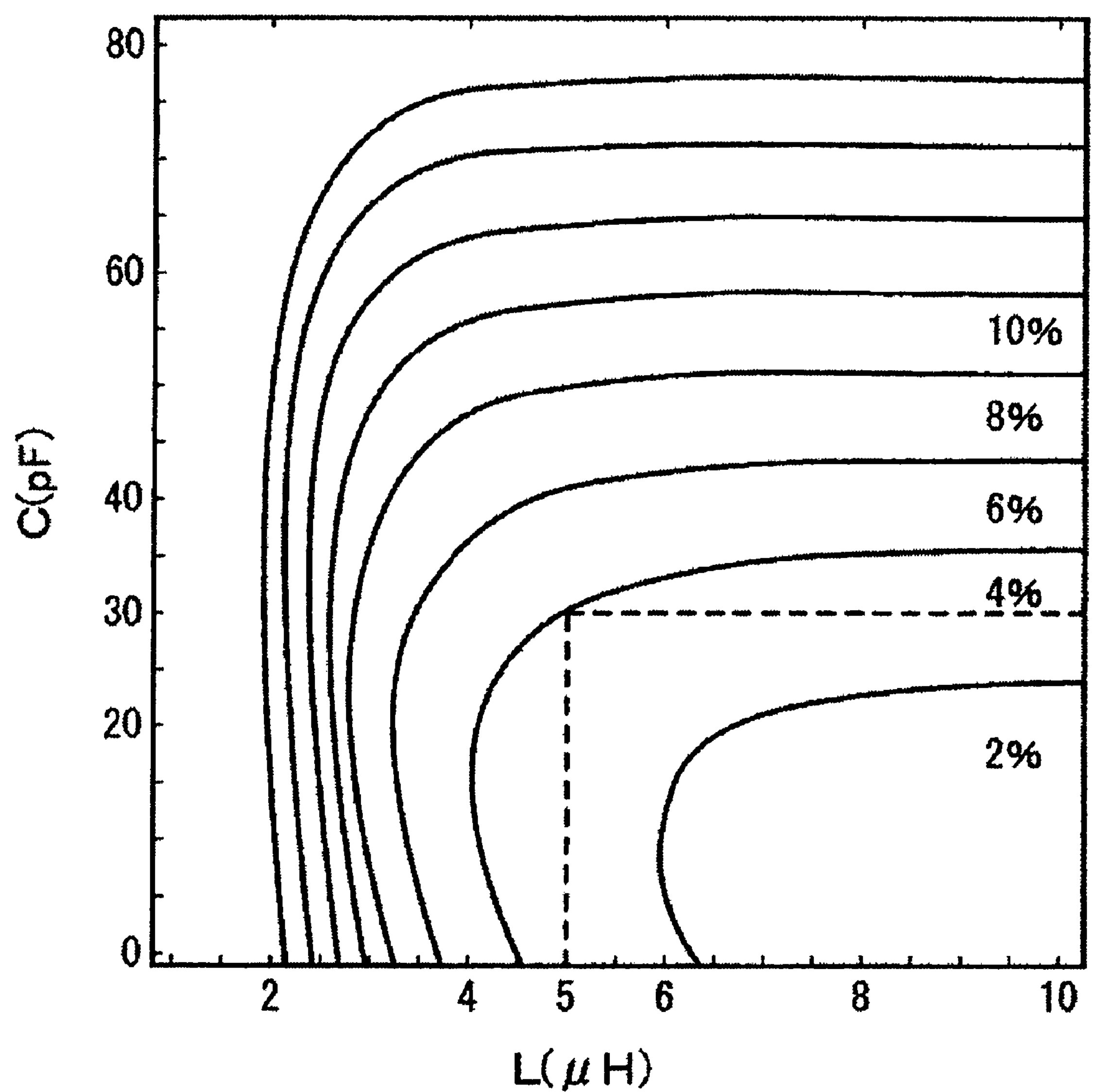
FIG. 8 represents a relationship between a filter power loss (%) and an inductance and a stray capacitance of the primary inductors.

As illustrated in FIG. 8, the filter power loss (%) decreases as the inductance L increases and as the stray capacitance C decreases. Moreover, it is clear that the filter power loss (%)

is certainly smaller than about 4% in a region where L is greater than or equal to about 5 μH and C is smaller than or equal to about 30 pF (the region being defined by a dashed line) even if L and C vary within that region. Meanwhile, in a region other than the above region, it is difficult or impossible to reduce the filter power loss (%) below about 4% and, also, the filter power loss (%) changes abruptly even by slight variation of L and C, thereby causing errors in mass production.

However, in a conventional plasma etching, an etching rate, which is a main indicator of a processing performance, has a repeatability tolerance of about 2% or less variance, and the filter power loss (%) needs to be smaller than or equal to about 4% which is twice the tolerance. Accordingly, if the inductance L of the primary inductors 108(1) and 108(2) is greater than or equal to about 5 AH and the stray capacitance C is smaller than or equal to about 30 pF, the repeatability tolerance of the etching rate can be surely satisfied, thus preventing the errors in the mass production. In this embodiment, the numerical conditions of L and C can be satisfied by constructing the filter unit 54(IN) as described above.

The present invention is not limited to the above-described embodiment, but can be variously modified within the scope of the technical concept of the present invention.

For example, in the plasma etching apparatus of the above embodiment, the heating element 40 provided in the susceptor 12 is divided into the inner heating wire 40(IN) and the outer heating wire 40(OUT) in a radial direction of the susceptor. However, the heating element may also be configured as a non-divided or a united body. In that case, each of the heater power supply and the power feed line is constructed as a single system.

Further, in the above embodiment, the primary inductors 108(1) and 108(2) in the filter units 54(IN) and 54(OUT) are divided into three air core coils (A(1), B(1), C(1)) and (A(2), B(2), C(2)), respectively. However, the primary inductors 108(1) and 108(2) can be divided into two air core coils (A(1), B(1)) and (A(2), P(2)), respectively, or can be constructed as a single air core coil A(1) and A(2), respectively.

In addition, the circuit configuration of the filter circuits 102(1) and 102(2) can be variously modified. For example, tertiary LC low pass filters can be sequentially connected to the rear ends of the secondary LS low pass filters 106(1) and 106(2).

In the above embodiment, the second high frequency (60 MHz) for plasma generation is applied to the shower head (upper electrode) 64. However, the present invention can also be applied to a lower plate dual frequency application type in which the second high frequency as well as the first high frequency (13.56 MHz) is applied to the susceptor 12. Further, there can be employed a lower plate single frequency application type in which the first high frequency (13.56 MHz) is exclusively applied to the susceptor 12 without the high frequency application to the upper electrode 64. The first high frequency applied to the upper electrode 64 is not limited to 13.56 MHz, and another frequency can also be employed. The case 120 used in the filter unit 52 is not limited to an airtight housing structure, but can have an opening in a part thereof.

Besides, the present invention can be applied to other plasma processing such as plasma CVD, plasma oxidation, plasma nitrification, sputtering and the like other than plasma etching. Further, as for a target substrate, the present invention may use various substrates for plat panel display, a photomask, a CD substrate, a printed circuit board or the like other than a semiconductor wafer.

While the invention has been shown and described with respect to the embodiments, it will be understood by those skilled in the art that various changes and modification may be made without departing from the scope of the invention as defined in the following claims.

What is claimed is:

1. A plasma processing apparatus comprising:

a first high frequency power for outputting a first high frequency, electrically connected to a first electrode disposed inside a depressurizable processing chamber;

a heater power supply electrically connected to a heating element provided in the first electrode via a first and a second filter circuit for reducing noise of the first high frequency;

a first and a second air core primary inductor provided in primary stages of the first and the second filter circuit when seen from the heating element; and a grounded conductive case for surrounding or accommodating the primary inductors, wherein a first and a second output terminal of the heater power supply are connected to a first and a second terminal of the heating element via the first and the second filter circuit, respectively, and wherein the first and the second primary inductor are arranged concentrically.

2. The plasma processing apparatus of claim 1, wherein the heating element is buried in a main surface of the first electrode via an insulator.

3. The plasma processing apparatus of claim 1, wherein the heating element is divided into an inner heating element and an outer heating element in a radial direction of an electrode, and individual heater power supplies are electrically connected to the inner heating element and the outer heating element via individual filter circuits.

4. The plasma processing apparatus of claim 1, wherein the case is made of stainless steel having a high relative magnetic permeability.

5. The plasma processing apparatus of claim 1, wherein a coolant passageway is provided in the first electrode or in a support member thermally coupled to the first electrode, and a coolant having a temperature controlled by a chiller unit is supplied to the coolant passageway.

6. The plasma processing apparatus of claim 1, wherein an inductance of the first and the second primary inductor is greater than or equal to about 5 μH, and a stray capacitance between the first and the second primary inductor and ground potential parts is smaller than or equal to about 30 pF.

7. The plasma processing apparatus of claim 6, wherein the first high frequency is 13.56 MHz or a frequency adjacent thereto.

8. The plasma processing apparatus of claim 1, wherein a number of air core coils forming the first primary inductor is equal to a number of air core coils forming the primary inductor, and air core coils in a first power feed line are arranged concentrically with air core coils in a second power feed line corresponding to the air core coils in the first power feed line in electrical arrangements in the power feed lines.

9. The plasma processing apparatus of claim 8, wherein spiral directions of coil wires are set such that a coupling coefficient of a mutual inductance is greater than zero between the air core coils in the first power feed line and the air core coils in the second power feed line, the air core coils being disposed concentrically.

10. The plasma processing apparatus of claim 1, wherein the first electrode serves as a lower electrode for mounting thereon a target object.

11. The plasma processing apparatus of claim 10, wherein the case is disposed immediately below a vicinity of the first electrode.

12. The plasma processing apparatus of claim 1, wherein the depressurizable processing chamber has therein a second electrode facing the first electrode in parallel, the first and the second electrode being separated from each other at a desired gap.

13. The plasma processing apparatus of claim 12, wherein the second electrode is electrically connected with a second high frequency power supply for outputting a second high frequency.

14. The plasma processing apparatus of claim 13, wherein the second high frequency is greater than or equal to about 40 MHz.

15. The plasma processing apparatus of claim 1, wherein the first and the second primary inductors are arranged to be spatially parallel to each other in the case, and are divided into a plurality of air core coils electrically connected in series.

16. The plasma processing apparatus of claim 15, wherein, among the air core coils, an air core coil positioned in a most primary stage of each of the first and the second primary inductor has a largest inductance than the other air core coils.

17. The plasma processing apparatus of claim 15, wherein, among the air core coils, an air core coil positioned in the most primary stage of each of the first and the second primary inductor has a smaller stray capacitance than the other air core coils.

18. The plasma processing apparatus of claim 15, wherein the plurality air core coils electrically connected in series are arranged substantially in a single row, and spiral directions and connections of coil wires are set such that a coupling coefficient of a mutual inductance therebetween is greater than zero.

19. The plasma processing apparatus of claim 15, wherein, primary capacitors are connected between ground potential parts and terminals of the primary inductors located away from the heating element, and first connection nodes between the primary inductors and the primary capacitors are electrically connected to an output terminal of the heater power supply.

20. The plasma processing apparatus of claim 19, wherein the primary capacitors are accommodated in the case.

21. The plasma processing apparatus of claim 19, wherein one terminal of secondary inductors are connected to the first connection nodes; secondary capacitors are connected between an other terminal of the secondary inductors and the ground potential parts; and second connection nodes between the secondary inductors and the secondary capacitors are electrically connected to an output terminal of the heater power supply.

22. The plasma processing apparatus of claim 21, wherein the secondary inductors and the secondary capacitors are accommodated in the case.

23. The plasma processing apparatus of claim 22, wherein a grounded electromagnetic shielding plate is provided between the primary inductors and the secondary inductors.

24. The plasma processing apparatus of claim 21, wherein the secondary inductors include coils each having a magnetic core.

* * * * *